(12) United States Patent
Wang et al.

(10) Patent No.: US 10,431,688 B2
(45) Date of Patent: Oct. 1, 2019

(54) THIN-FILM TRANSISTOR STRUCTURE WITH THREE-DIMENSIONAL FIN-SHAPE CHANNEL AND PREPARATION METHOD THEREOF

(71) Applicants: Sun Yat-Sen University, Guangzhou (CN); SUN YAT-SEN UNIVERSITY CARNEGIE MELLON UNIVERSITY SHUNDE INTERNATIONAL JOINT RESEARCH INSTITUTE, Guangdong (CN)

(72) Inventors: Kai Wang, Guangzhou (CN); Hai Ou, Guangzhou (CN); Jun Chen, Guangzhou (CN)

(73) Assignees: SUN YAT-SEN UNIVERSITY, Guangdong (CN); SUN YAT-SEN UNIVERSITY CARNEGIE MELLON UNIVERSITY SHUNDE INTERNATIONAL JOINT RESEARCH INSTITUTE, Guangdong (CN)

( * ) Notice: Subject to any disclaimer, the term of this patent is extended or adjusted under 35 U.S.C. 154(b) by 0 days.

(21) Appl. No.: 15/749,969

(22) PCT Filed: Jul. 30, 2016

(86) PCT No.: PCT/CN2016/092450
§ 371 (c)(1),
(2) Date: Feb. 2, 2018

(87) PCT Pub. No.: WO2017/020796
PCT Pub. Date: Feb. 9, 2017

(65) Prior Publication Data
US 2018/0233599 A1    Aug. 16, 2018

(30) Foreign Application Priority Data
Aug. 4, 2015    (CN) .......................... 2015 1 0472392

(51) Int. Cl.
*H01L 29/66* (2006.01)
*H01L 29/786* (2006.01)
(Continued)

(52) U.S. Cl.
CPC .. *H01L 29/78603* (2013.01); *H01L 29/42384* (2013.01); *H01L 29/66* (2013.01);
(Continued)

(58) Field of Classification Search
CPC ............... H01L 29/78603; H01L 29/66; H01L 29/66477; H01L 29/7848; H01L 29/785; H01L 31/022408
See application file for complete search history.

(56) References Cited

U.S. PATENT DOCUMENTS 8,928,080 B2 *  1/2015  Sun ....................... H01L 29/785
                                                              257/347
2009/0073334 A1 *  3/2009  Honda ................. G09G 3/3685
                                                              349/38
(Continued)

FOREIGN PATENT DOCUMENTS

CN    101789398 A    7/2010
CN    103730512 A    4/2014
(Continued)

OTHER PUBLICATIONS

International Search report dated Nov. 4, 2016 from PCT/CN2016/092450, 4 pgs.

*Primary Examiner* — Kyoung Lee
(74) *Attorney, Agent, or Firm* — JCIPRNET

(57) ABSTRACT

The present invention discloses a thin-film transistor structure with a three-dimensional fin-shape channel and a prepa-
(Continued)

ration method thereof. The preparation method includes following steps: (a) depositing and etching a bottom gate electrode on a substrate; (b) depositing a bottom dielectric layer at an upper part of a structure obtained from the step (a), and sequentially depositing a semiconductor film on the bottom dielectric layer; (c) etching the semiconductor film to obtain a fin-type channel; (d) respectively depositing an ohmic contact layer, a source electrode and a drain electrode on the semiconductor film located at both sides of the fin-shape channel, and etching; (e) depositing a top dielectric layer and a top gate electrode at an upper part of a structure obtained from the step (d); and (f) etching the top gate electrode, an completing a preparation of a thin-film transistor with a dual-gate three-dimensional fin-shape channel.

3 Claims, 4 Drawing Sheets

(51) Int. Cl.
*H01L 29/78* (2006.01)
*H01L 31/0224* (2006.01)
*H01L 29/423* (2006.01)

(52) U.S. Cl.
CPC ...... *H01L 29/66477* (2013.01); *H01L 29/785* (2013.01); *H01L 29/7848* (2013.01); *H01L 29/78618* (2013.01); *H01L 29/78648* (2013.01); *H01L 29/78696* (2013.01); *H01L 31/022408* (2013.01)

(56) References Cited

U.S. PATENT DOCUMENTS

| | | | | |
|---|---|---|---|---|
| 2014/0008647 | A1* | 1/2014 | Yamazaki | H01L 29/7869 257/43 |
| 2014/0326992 | A1* | 11/2014 | Hondo | H01L 29/78696 257/43 |
| 2016/0035865 | A1* | 2/2016 | Nagamatsu | H01L 21/8221 438/104 |
| 2016/0111545 | A1* | 4/2016 | Tanaka | H01L 29/7869 257/43 |
| 2016/0172500 | A1* | 6/2016 | Yamazaki | H01L 29/7869 257/43 |

FOREIGN PATENT DOCUMENTS

| | | |
|---|---|---|
| CN | 103762251 A | 4/2014 |
| CN | 105261638 A | 1/2016 |

\* cited by examiner

THIN-FILM TRANSISTOR STRUCTURE WITH THREE-DIMENSIONAL FIN-SHAPE CHANNEL AND PREPARATION METHOD THEREOF

CROSS REFERENCE TO RELATED APPLICATIONS

The present application is a national phase entry under 35 U.S.C. § 371 of International Application No. PCT/CN2016/092450, filed Jul. 30, 2016, which claims priority from Chinese Patent Application No. 201510472392.6 filed Aug. 4, 2015, all of which are hereby incorporated herein by reference.

TECHNICAL FIELD

The present invention relates to the field of transistor, and more specifically, to a thin-film transistor structure with a three-dimensional fin-shape channel and a preparation method thereof.

BACKGROUND

At present, almost all thin-film transistors adopt a planar channel structure, that is, the channel is flat. With a continuous decrease of a length of the channel, a gate control loss caused by a short channel effect and a soft saturation phenomenon of an output current are more and more severe, and have become one of the major challenges for a small-size thin-film transistor. Some researchers have attempted to solve this problem by adopting a vertical channel structure, but the thin-film transistor with the vertical structure faces many new problems in aspects of process and integration. In addition, in the field of photoelectric detection, a thickness of the channel directly determines light absorption efficiency. However, if the channel adopts the same thickness, an increase of the thickness will increase a contact resistance of a source-drain electrode region, which is not conducive to a fast switching of the thin-film transistor.

SUMMARY OF THE INVENTION

In order to overcome above-described deficiencies of the prior arts, the present invention first proposes a preparation method of a thin-film transistor structure with a three-dimensional fin-shape channel. The transistor prepared by this method increases a thickness of a semiconductor film in a channel region and decreases a thickness of a semiconductor film in a source and drain region.

Another objective of the present invention is to propose a thin-film transistor with a three-dimensional fin-shape channel structure.

In order to realize the above-described objective, a technical solution of the present invention is as follows:

a preparation method of a thin-film transistor structure with a three-dimensional fin-type channel, the channel having a fin-type structure which is thick in a middle and thin in both sides, and a preparation process is specifically as follows:

(a) depositing and etching a bottom gate electrode on a substrate;

(b) depositing a bottom dielectric layer at an upper part of a structure obtained from the step (a), and sequentially depositing a semiconductor film on the bottom dielectric layer;

(c) etching the semiconductor film to obtain a fin-type channel;

(d) respectively depositing a source electrode and a drain electrode on the semiconductor film located at both sides of the fin-shape channel, and etching;

(e) depositing a top dielectric layer and a top gate electrode at an upper part of a structure obtained from the step (d); and (f) etching the top gate electrode, and completing a preparation of a dual-gate fin-shape channel thin-film transistor.

Some thin-film transistors do not require an Ohmic contact layer, but some require an Ohmic contact layer, so further, an Ohmic contact layer is deposited among the source electrode, the drain electrode and the fin-shape channel.

A thin-film transistor structure with a three-dimensional fin-shape channel structure prepared by the above-described method, comprises: a substrate, a bottom gate electrode located at an upper part of the substrate, a bottom dielectric layer located at an upper part of the bottom gate electrode, a fin-shape channel located at an upper part of the bottom dielectric layer, a source electrode and a drain electrode which are located at both sides of the fin-shape channel, an Ohmic contact layer among the source electrode, the drain electrode and the fin-shape channel, a top dielectric layer located at upper parts of the fin-shape channel, the source electrode and the drain electrode, and a top gate electrode located at an upper part of the top dielectric layer.

The present invention proposes a preparation method of a thin-film transistor with a fin-shape channel structure, which is composed of a series of photolithography and etches. The biggest difference between the thin-film transistor with the fin-shape channel structure prepared by this method and the thin-film transistor with a conventional planar channel structure is that a thickness of the semiconductor film in a channel region is increased while a thickness of a semiconductor film in a source-drain region is reduced.

Compared with the prior arts, the above-described thin-film transistor with the fin-shape channel structure has following characteristics: 1) for the thin-film transistor with a top gate electrode structure, an actual channel length is increased, alleviating a short channel effect, especially for a polysilicon thin-film transistor with a smaller device size, and a requirement of high-density integration is met since an overall device size does not increase; and 2) in a photoelectric thin-film transistor, a sufficiently thick channel layer ensures a light absorption, while a sufficiently thin semiconductor film in contact with the source drain electrode ensures a low contact resistance, so that its output characteristic curve does not deteriorate.

The above-described preparation method may also prepare a plurality of thin-film transistors with a fin-shape structure and realize a parallel connection and a series connection among the thin-film transistors by a photolithography technique. Main application fields of the above-described thin-film transistor with the fin-shape channel structure include high-resolution display, photoelectric detection and imaging, as well as biomedical sensors, etc.

DETAILED DESCRIPTION OF THE PREFERED EMBODIMENT

Figure 1:
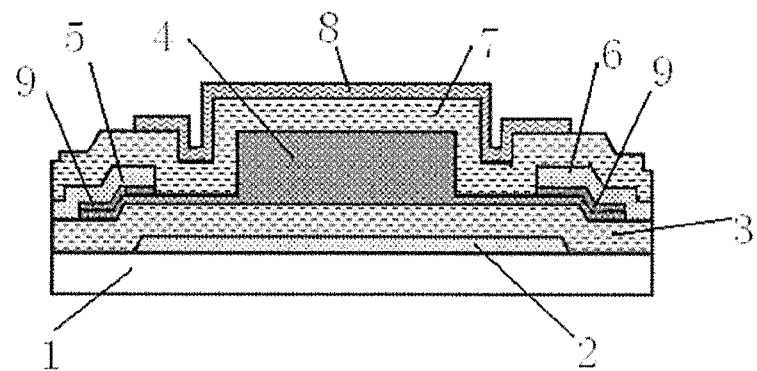
FIG. 1 is a cross-section structure diagram of a thin-film transistor with a fin-shape channel structure.
Figure 2A:
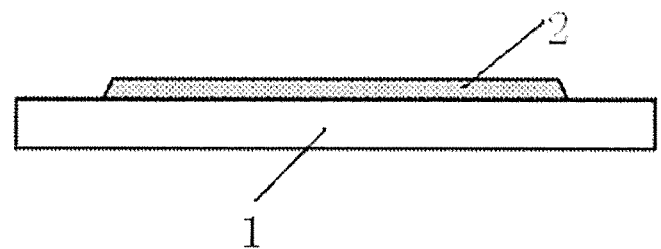
FIG. 2A to FIG. 2F are a preparation flow chart of a thin-film transistor with a fin-shape channel structure.
Figure 2B:
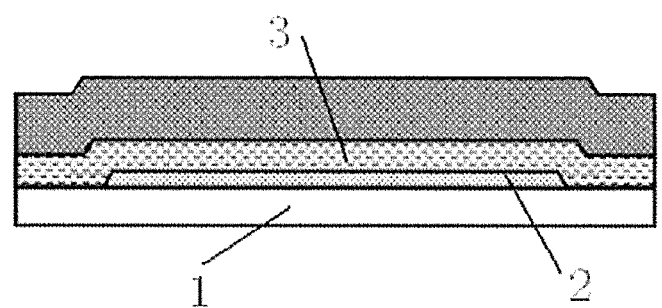
Figure 2C:
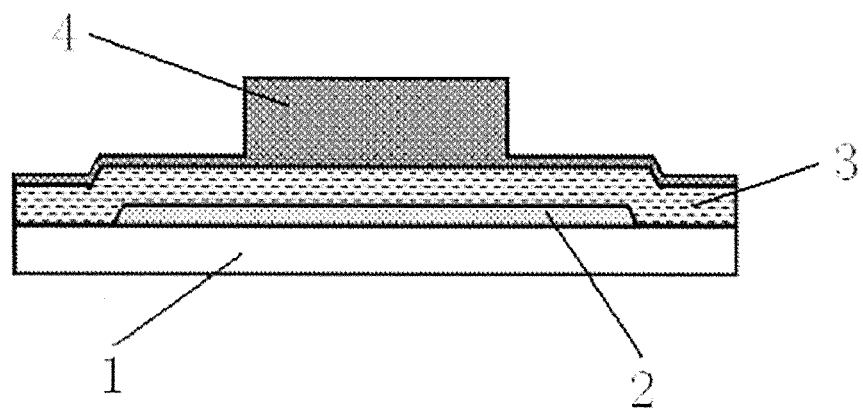
Figure 2D:
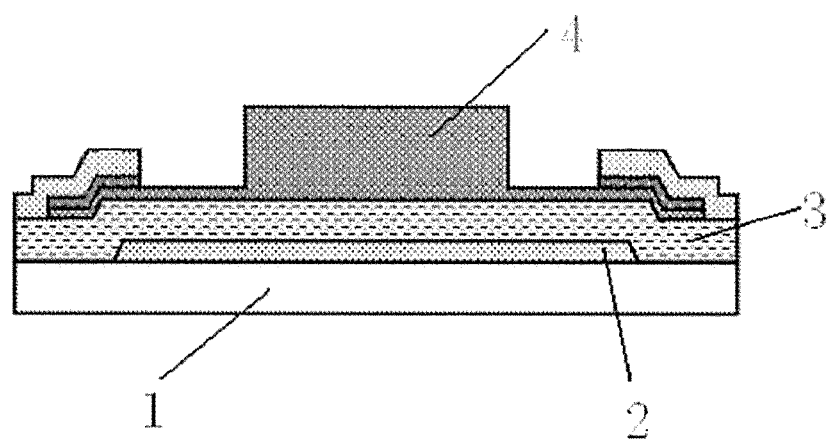
Figure 2E:
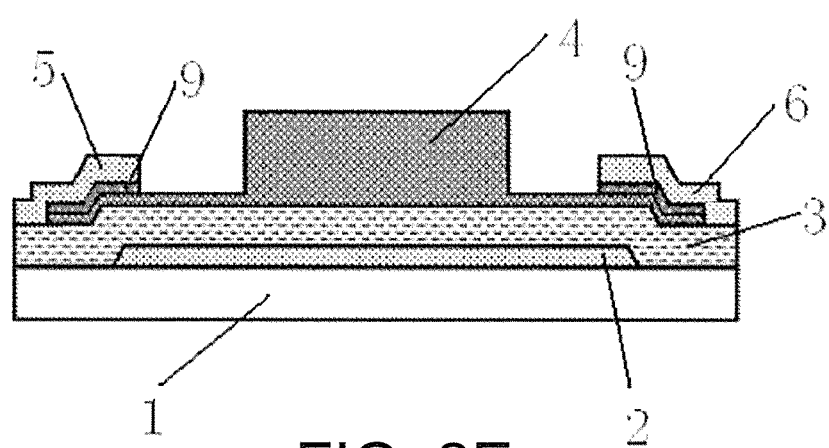
Figure 2F:
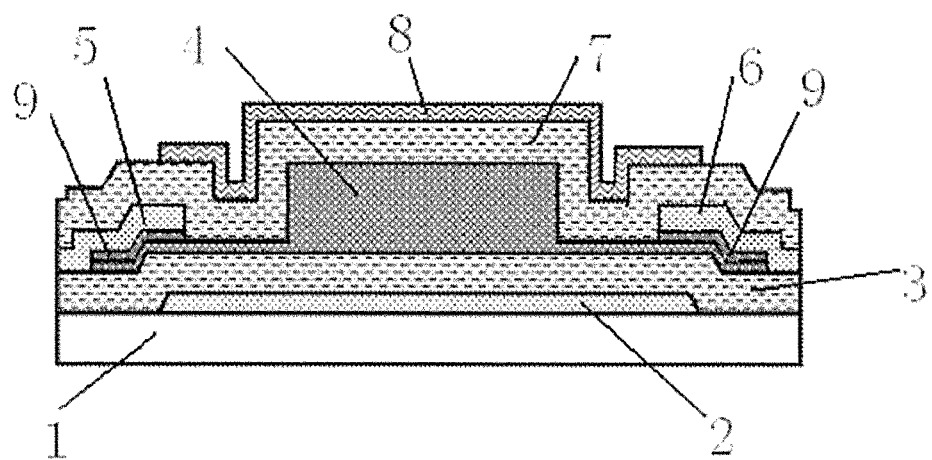

The present invention is further described below in combination with accompanying drawings, but implementations of the present invention are not limited hereto.

As shown in FIG. 2A to FIG. 2F, it is a preparation method of a thin-film transistor structure with a three-dimensional fin-shape channel, the channel having a fin-shape structure which is thick in a middle and thin on both sides, process procedure and the method includes following steps:

(a) depositing and etching a bottom gate electrode 2 on a substrate 1;

(b) depositing a bottom dielectric layer 3 at an upper part of a structure obtained from the step (a), and sequentially depositing a semiconductor film on the bottom dielectric layer 3;

(c) etching the semiconductor film to obtain a fin-shape channel 4;

(d) successively depositing an Ohmic contact layer 9 and a source electrode 5 on the semiconductor film located at one side of the fin-type channel 4 and etching, and successively depositing the Ohmic contact layer 9 and a drain electrode 6 on the semiconductor film located at the other side and etching;

(e) depositing a top dielectric layer 7 and a top gate electrode 8 at an upper part of a structure obtained from the step (d); and (f) etching the top gate electrode 8, and completing a preparation of a dual-gate fin-shape channel thin-film transistor.

As shown in FIG. 1, a thin-film transistor structure with a three-dimensional fin-shape channel structure prepared by the above-described method comprises: a substrate 1, a bottom gate electrode 2 located at an upper part of the substrate 1, a bottom dielectric layer 3 located at an upper part of the bottom gate electrode 2, a fin-shape channel 4 located at an upper part of the bottom dielectric layer 3, a source electrode 5 and a drain electrode 6 which are located at both sides of the fin-type channel 4, an Ohmic contact layer 9 among the source electrode 5, the drain electrode 6 and the fin-shape channel 4, a top dielectric layer 7 located at upper parts of the fin-shape channel 4, the source electrode 5 and the drain electrode 6, and a top gate electrode 8 located at an upper part of the top dielectric layer.

The present invention proposes a preparation method of a thin-film transistor with a fin-shape channel structure, which is composed of a series of photolithography and etches. The biggest difference between the thin-film transistor with the fin-shape channel structure prepared by this method and the thin-film transistor with a conventional planar channel structure is that a thickness of the semiconductor film in a channel region is increased while a thickness of a semiconductor film in a source-drain region is reduced.

Compared with the prior arts, the above-described thin-film transistor with the fin-shape channel structure has following characteristics: 1) for the thin-film transistor with a top gate electrode structure, an actual channel length is increased, alleviating a short channel effect, especially for a polysilicon thin-film transistor with a smaller device size, and a requirement of high-density integration is met since an overall device size does not increase; and 2) in a dual-gate photoelectric thin-film transistor, a sufficiently thick channel layer ensures a light absorption, while a sufficiently thin semiconductor film in contact with the source drain electrode ensures a low contact resistance, so that its output characteristic curve does not deteriorate.

The above-described preparation method of the thin-film transistor with the fin-shape channel structure may also be suitable for preparing a plurality of thin-film transistors with fin-shape structure and realize a parallel connection and a series connection among the thin-film transistors. Main application fields of the above-described thin-film transistor with the fin-shape channel structure include high resolution display, photoelectric detection and imaging, as well as biomedical sensors, etc.

Figure 3A:
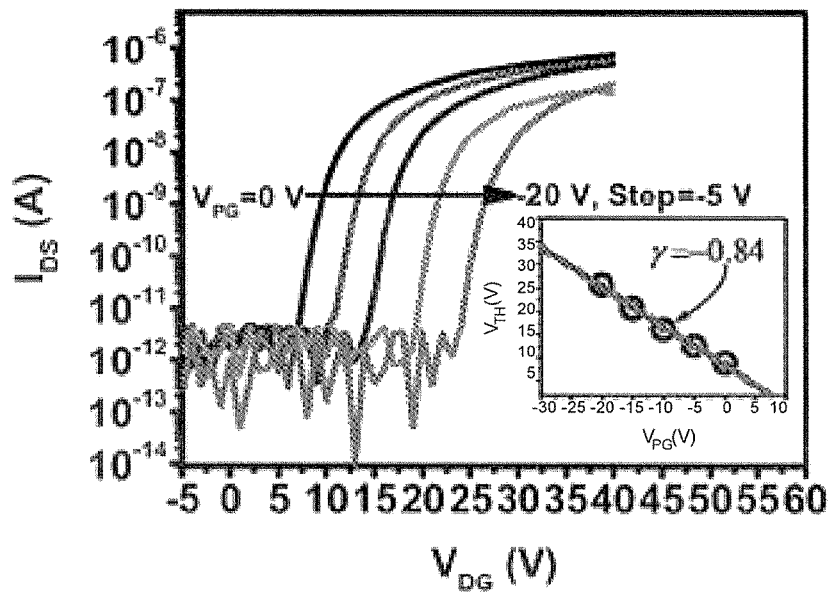
FIG. 3A and FIG. 3B are respectively an output characteristic curve and a transfer characteristic curve of the prepared device.
Figure 3B:
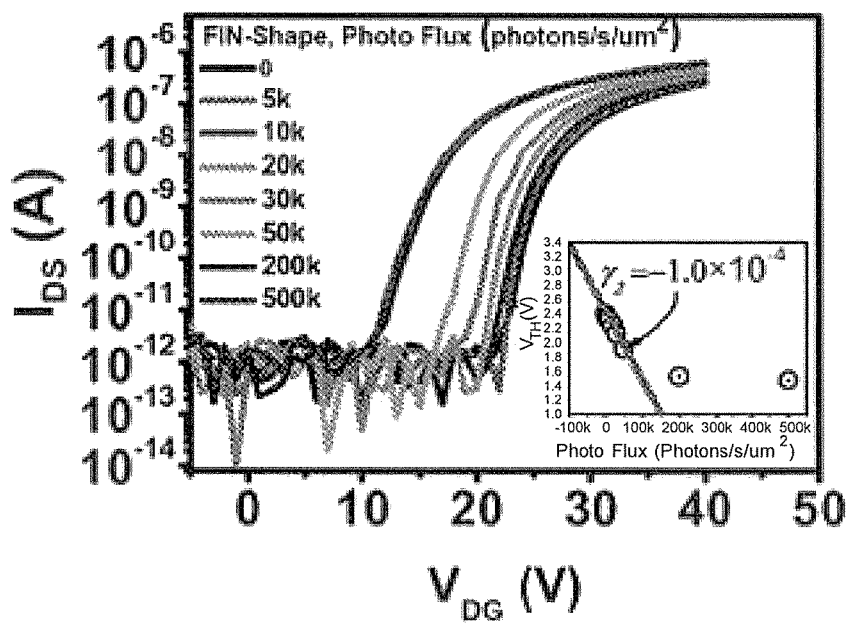

FIG. 3A is a dark-state transfer characteristic curve of the thin-film transistor with the three-dimensional fin-shape channel, a control of a top gate to the channel is reflected in that the transfer characteristic curve shifts with a size of the top gate, that is, a sensitivity of a threshold voltage to a top gate voltage, wherein r is a sensitivity coefficient; and FIG. 3B is a transfer characteristic curve under light, and it can be seen that the transfer characteristic curve shifts with a light intensity, which illustrates that the device is sensitive to light, wherein r2 is sensitivity coefficient of the threshold voltage to a photovoltage.

The above-described implementations of the present invention do not constitute a limitation of the scope of protection of the present invention. Any amendments, equivalent replacements and improvements made within the spirit and principle of the present invention shall all be included within the scope of protection of the claims of the present invention.

What is claimed:

1. A preparation method of a thin-film transistor structure with a three-dimensional fin-shape channel, characterized in that, the channel has a fin-type structure which is thick in a middle and thin in both sides, and a preparation process is specifically as follows:

(a) depositing and etching a bottom gate electrode on a substrate;

(b) depositing a bottom dielectric layer at an upper part of a structure obtained from the step (a), and sequentially depositing a semiconductor film on the bottom dielectric layer;

(c) etching the semiconductor film to obtain a fin-shape channel;

(d) respectively depositing a source electrode and a drain electrode on the semiconductor film located at both sides of the fin-shape channel, and etching, wherein the source electrode and the drain electrode are not located on a thick portion of the fin-shape channel;

(e) depositing a top dielectric layer and a top gate electrode at an upper part of a structure obtained from the step (d); and (f) etching the top gate electrode, and completing a preparation of a dual-gate fin-shape channel thin-film transistor.

2. The preparation method of the thin-film transistor with the three-dimensional fin-shape channel structure according to claim 1, wherein an Ohmic contact layer is deposited among the source electrode, the drain electrode and the fin-shape channel.

3. A thin-film transistor structure with a three-dimensional fin-shape channel structure prepared by the method according to claim 2, characterized in that, the thin-film transistor structure comprises: a substrate, a bottom gate electrode located at an upper part of the substrate, a bottom dielectric layer located at an upper part of the bottom gate electrode, a fin-shape channel located at an upper part of the bottom dielectric layer, a source electrode and a drain electrode which are located at both sides of the fin-shape channel, an Ohmic contact layer among the source electrode, the drain electrode and the fin-shape channel, a top dielectric layer located at upper parts of the fin-type channel, the source electrode and the drain electrode, and a top gate electrode located at an upper part of the top dielectric layer.

\* \* \* \* \*